(12) United States Patent
Tachikawa et al.

(10) Patent No.: US 6,767,848 B2
(45) Date of Patent: Jul. 27, 2004

(54) SILICON SEMICONDUCTOR SUBSTRATE AND METHOD FOR PRODUCTION THEREOF

(75) Inventors: Akiyoshi Tachikawa, Yamaguchi (JP); Kazunori Ishisaka, Yamaguchi (JP)

(73) Assignee: Wacker Siltronic Gesellschaft Für Halbleiter Materialien AG, Burghausen (DE)

( * ) Notice: Subject to any disclaimer, the term of this patent is extended or adjusted under 35 U.S.C. 154(b) by 0 days.

(21) Appl. No.: 10/241,180

(22) Filed: Sep. 11, 2002

(65) Prior Publication Data

US 2003/0134520 A1 Jul. 17, 2003

(30) Foreign Application Priority Data

Sep. 14, 2001 (JP) ........................................ 2001-280460

(51) Int. Cl.⁷ ........................ H01L 21/31; H01L 21/469
(52) U.S. Cl. ........................................ 438/775; 438/770
(58) Field of Search ................................ 438/474, 475, 438/663, 770, 772–774, 775, 778, 779, 781, 783, 788, 792

(56) References Cited

U.S. PATENT DOCUMENTS

| | | | | |
|---|---|---|---|---|
| 5,935,320 A | * | 8/1999 | Graef et al. | 117/2 |
| 5,968,264 A | * | 10/1999 | Iida et al. | 117/30 |
| 6,113,687 A | * | 9/2000 | Horai et al. | 117/20 |
| 6,299,982 B1 | * | 10/2001 | Tamatsuka et al. | 428/446 |
| 6,514,335 B1 | * | 2/2003 | Egashira et al. | 117/13 |

FOREIGN PATENT DOCUMENTS

| | | |
|---|---|---|
| EP | 0829559 | 3/1998 |
| EP | 0942078 | 9/1999 |
| EP | 0962557 | 12/1999 |
| EP | 1035235 | 9/2000 |
| EP | 1087042 | 3/2001 |
| EP | 1154 048 | 11/2001 |
| EP | 1215309 | 6/2002 |
| JP | 06-252154 | 9/1994 |
| JP | 11-135511 | 5/1999 |
| JP | 2000-256092 | 9/2000 |
| WO | 99/57344 | 11/1999 |
| WO | 01/16409 | 3/2001 |
| WO | 01/38611 | 5/2001 |

OTHER PUBLICATIONS

English Derwent Abstract AN2000–023590 corresponding to WO99/57344.

Patent Abstract of Japan corresponding to JP 06–252154.

Patent Abstract of Japan corresponding to JP 11–135511.

* cited by examiner

*Primary Examiner*—David Nhu
(74) *Attorney, Agent, or Firm*—Collard & Roe, P.C.

(57) ABSTRACT

A silicon semiconductor substrate which realizes a defect-free region of void type crystals to a greater depth and allows the duration of production to be decreased and a method for the production thereof are provided. A silicon semiconductor substrate derived from a silicon single crystal grown by the Czochralski method or the magnetic field-applied Czochralski method, which is obtainable by using a silicon semiconductor substrate satisfying the relational expression, $0.2 \geq V/S/R$, providing V denotes the volume of void type defects, S denotes the surface area thereof, and R denotes the radius of spherical defects presumed to have the same volume as the void defects having the volume of V, and heat treating this substrate at a temperature exceeding 1150° C.

10 Claims, No Drawings

is suspected of manifesting its effect only insufficiently unless the addition of nitrogen is made in an adequate amount. From the viewpoint of permitting manufacture of a commercially useful silicon semiconductor substrate enjoying extinction of void type defects throughout to a deep region from the surface layer, therefore, the prior art is at a disadvantage in lacking limitations of conditions.

SILICON SEMICONDUCTOR SUBSTRATE AND METHOD FOR PRODUCTION THEREOF

BACKGROUND OF THE INVENTION

1. Field of the Invention

This invention relates to a silicon semiconductor substrate and a method for the production thereof. More particularly, the invention relates to a silicon semiconductor substrate which originates in a silicon semiconductor substrate so shaped as to permit easy extinction of void type defects by a heat treatment with a view to obtaining a defect-free region in a void type product and which, in consequence of a subsequent heat treatment, forms a deep defect-free surface layer, excels in device characteristics, and enjoys a satisfactory gettering property and to a method for the production thereof.

2. The Prior Art

Heretofore, as regards the improvement of the defect-freeness of the surface layer of the semiconductor substrate, the technique of heat-treating a given semiconductor substrate in an atmosphere of hydrogen gas at a temperature of 1200° C. for a duration of not less than one hour thereby inducing expansion of a defect-free layer devoid of oxygen precipitate defects to a depth of 10 μm from the surface layer has been reported (JP-A-06-252,154). This technique has been known to effect the extinction of void type defects (i.e. "empty hole" type defects) to a depth of 1 to 3 μm. Recently, the technique of effecting the extinction of the void type defects to a deeper region from the surface layer by decreasing the void type defects in size at a high density in consequence of the addition of nitrogen has been reported (JP-A-11-135,511 and JP-A-2000-256,092). In the latter invention, it is reported that the change in form of void type defects attracted interest and the addition of nitrogen in a pertinent shape of the defects proved effective.

The prior art mentioned above has barely unveiled the effect of the addition of nitrogen on the change of form manifested in the void type defects. Regarding the heat treatment which is performed for the purpose of effecting extinction of the void type defects, it has not imposed any limitation on the effective nitrogen concentration, the oxygen concentration, and the cooling rate to be used while the silicon single crystal being pulled passes through a temperature zone of 1100° C. (hereinafter referred to simply as "cooling rate"). Specifically, in the void type defects, the voids which are point defects are diffused through the surface of the void type defects during the extinction thereof by the heat treatment. The diffusion in this case is proportional to the surface area forming the peripheral parts of the void type defects. The mere mention of the effect in the change of form does not deserve to be deemed as imposing a necessary limitation on the extinction of void type defects.

In fact, the heat treatment contemplated by the prior art induces extinction of the defects barely to the extent of recording a residual ratio on the order of percent at a depth of 0.5 μm from the surface layer. It has not imposed on the void type defects a limitation enough for effecting extinction of the void type defects to such a density that the manufacture of a device under production conditions excelling in commercial productivity will not be adversely affected.

Owing to the current demand to produce silicon single crystals in increased diameters, the void type defects possibly gain unduly in growth, depending on the relevant production conditions. In the light of this fact, the prior art

SUMMARY OF THE INVENTION

It is, therefore, an object of this invention to provide a novel silicon semiconductor substrate and a method for the production thereof in view of such drawbacks of the prior art as mentioned above.

To be specific, this invention is capable of effecting extinction of void type defects to a deep region from the surface layer, the feature which has not been attained by the prior art. For a fixed temperature of the heat treatment, this invention is capable of attaining the extinction of the void type defects to a region of a greater depth than the prior art.

This invention is directed to providing a method of production which enables a silicon semiconductor substrate possessing a defect-free layer of a required depth to be manufactured by performing a heat treatment for a shorter duration than the prior art in forming the defect-free layer in a fixed depth. The objects mentioned above are accomplished by the following items (1)–(10).

(1) A silicon semiconductor substrate derived from a silicon single crystal grown by the Czochralski method or the magnetic field-applied Czochralski method, characterised by satisfying the relation, $0.2 \geq V/S/R$, providing V denotes the volume of void type defects, S the surface area thereof, and R the radius of spherical defects presumed to have the same volume as the void type defects having the volume of V.

(2) A silicon semiconductor substrate set forth in item (1) above, which contains nitrogen at a concentration of not less than $1 \times 10^{14}$ atoms/cm$^3$ and not more than $1 \times 10^{16}$ atoms/cm$^3$.

(3) A silicon semiconductor substrate set forth in item (1) above, wherein the void type defects in the silicon semiconductor substrate having an oxygen concentration of not more than $9.5 \times 10^{17}$ atoms/cm$^3$ and a nitrogen concentration of not less than $5 \times 10^{14}$ atoms/cm$^3$ and not more than $1 \times 10^{16}$ atoms/cm$^3$, when presumed to have spherical volumes, have a radius R satisfying $R \leq 30$ nm.

(4) A silicon semiconductor substrate set forth in item (1) above, wherein the void type defects in the silicon semiconductor substrate having an oxygen concentration of not more than $8.5 \times 10^{17}$ atoms/cm$^3$ and a nitrogen concentration of not less than $5 \times 10^{14}$ atoms/cm$^3$ and not more than $1 \times 10^{16}$ atoms/cm$^3$, when presumed to have spherical volumes, have a radius R satisfying $R \leq 75$ nm.

(5) A method for the production of a silicon semiconductor substrate, characterised by causing a silicon semiconductor substrate set forth in item (1) above as derived from a silicon single crystal grown by the Czochralski method or the magnetic field-applied Czochralski method using a cooling rate of not less than 1° C./min while the silicon single crystal being pulled passes through a temperature zone of 1100° C. to be heat-treated in a non-oxidising atmosphere at a temperature of not less than 1150° C. for not less than one hour at least.

(6) A method for the production of a silicon semiconductor substrate, characterised by causing a silicon semiconductor substrate set forth in item (2) above as derived from a silicon single crystal grown by the Czochralski method or the magnetic field-applied Czochralski method using molten silicon containing nitrogen at a concentration of not less than $1 \times 10^{17}$ atoms/cm³ and not more than $1.5 \times 10^{19}$ atoms/cm³ and using a cooling rate of not less than 1° C./min while the silicon single crystal being pulled passes through a temperature zone of 1100° C. to be heat-treated in a non-oxidising atmosphere at a temperature of not less than 1150° C. for not less than one hour at least.

(7) A method for the production of a silicon semiconductor substrate, characterised by causing a silicon semiconductor substrate set forth in item (3) above as derived from a silicon single crystal grown by the Czochralski method or the magnetic field-applied Czochralski method using molten silicon containing nitrogen at a concentration of not less than $5 \times 10^{17}$ atoms/cm³ and not more than $1.5 \times 10^{19}$ atoms/cm³ and using a cooling rate of not less than 5° C./min while the silicon single crystal being pulled passes through a temperature zone of 1100° C. to be heat-treated in a non-oxidising atmosphere at a temperature of not less than 1150° C. for not less than one hour at least.

(8) A method for the production of a silicon semiconductor substrate, characterised by causing a silicon semiconductor substrate set forth in item (4) above as derived from a silicon single crystal grown by the Czochralski method or the magnetic field-applied Czochralski method using molten silicon containing nitrogen at a concentration of not less than $1 \times 10^{8}$ atoms/cm³ and not more than $1.5 \times 10^{19}$ atoms/cm³ and using a cooling rate of not less than 1° C./min and less than 5° C./min while the silicon single crystal being pulled passes through a temperature zone of 1100° C. to be heat-treated in a non-oxidising atmosphere at a temperature of not less than 1150° C. for not less than one hour at least.

(9) A method for the production of a silicon semiconductor substrate, characterised by heat-treating a silicon semiconductor substrate set forth in item (3) above in a non-oxidising atmosphere at a temperature of not less than 1200° C. thereby causing the semiconductor substrate to acquire an oxygen concentration of not more than $6 \times 10^{16}$ atoms/cm³ at a depth of 1 μm from the surface at the centre thereof, a locally concentrated part originating in a nitrogen segregation exhibiting a concentration of not less than twice as high as the average signal strength at the centre of the silicon substrate depth in the determination of nitrogen concentration by the method of secondary ion mass analysis (SIMS), a surface defect-free layer of a depth of not less than 5 μm at least and less than 12 μm from the surface, and an oxygen precipitate density of not less than $1 \times 10^{9}$ pieces/cm³ at the centre of depth of the central part of the silicon substrate.

(10) A method for the production of a silicon semiconductor substrate, characterised by heat-treating a silicon semiconductor substrate set forth in item (4) above in a non-oxidising atmosphere at a temperature of not less than 1200° C. thereby causing the semiconductor substrate to acquire an oxygen concentration of not more than $5 \times 10^{16}$ atoms/cm³ at a depth of 1 μm from the surface at the centre thereof, a locally concentrated part originating in a nitrogen segregation exhibiting a concentration of not less than twice as high as the average signal strength at the centre of the silicon substrate depth in the determination of nitrogen concentration by the method of secondary ion mass analysis (SIMS), a surface defect-free layer of a depth of not less than 5 μm at least and less than 12 μm from the surface, and an oxygen precipitate density of not less than $5 \times 10^{8}$ pieces/cm³ at the centre of depth of the central part of the silicon substrate.

The silicon semiconductor substrate according to this invention is obtained by slicing a segment of a prescribed thickness from a silicon single crystal grown by the Czochralski method (hereinafter referred to as "CZ method") or the magnetic field-applied Czochralski method (hereinafter referred to as "magnetic field-applied CZ method").

To be specific, the CZ method comprises growing a silicon single crystal bar of a required diameter by causing a seed crystal to contact the melt of a polycrystalline silicon raw material accommodated in a quartz crucible and slowly pulling it upward as kept in rotation meanwhile. The crystal while being pulled can be doped with nitrogen by having a nitride placed in advance in the quartz crucible or injecting the nitride into the molten silicon or having the ambient gas encircling the site of crystal growth contain nitrogen from the beginning. In this case, the amount of the dopant incorporated into the crystal can be controlled by adjusting the amount of the nitride, the concentration of the nitrogen gas, or the duration of the injection. The magnetic field-applied CZ method is identical with the CZ method, except it performs the operation of pulling a crystal bar while continuing application of a magnetic field to the interior of the quartz crucible. In this manner, the nitrogen concentration can be easily controlled in the range of $1 \times 10^{17} \sim 1.5 \times 10^{19}$ atoms/cm³ in the silicon melt or in the range of $1 \times 10^{14} \sim 1 \times 10^{16}$ atoms/cm³ in the silicon single crystal.

Further, this invention prefers the oxygen concentration in the silicon single crystal bar to be controlled in the range of $6 \times 10^{17} \sim 1 \times 10^{18}$ atoms/cm³ during the growth of the single crystal bar doped with nitrogen by the CZ method or the magnetic field-applied CZ method.

During the growth of the silicon single crystal bar, the necessity for decreasing the oxygen concentration in this crystal bar to a level in the range mentioned above may be fulfilled by any of the methods heretofore adopted popularly. The adjustment of the oxygen concentration in the range mentioned above can be easily attained by such means as, for example, decreasing the rotational frequency of the crucible, increasing the flow rate of the gas to be introduced, lowering the atmospheric pressure, and adjusting the temperature distribution and the convection in the molten silicon.

Further, this invention, while growing the silicon single crystal bar doped with nitrogen by the CZ method or the magnetic field-applied CZ method, prefers the cooling rate of the growing crystal to be controlled in the range of 1~15° C./min. Actually, the realisation of these conditions for the production of crystal may be attained, for example, by a method of adjusting the pulling speed of the crystal thereby increasing or decreasing the speed of the growth of the crystal. It may be otherwise attained by installing within the chamber of an apparatus for the production of a silicon single crystal by the CZ method or the magnetic field-applied CZ method a device which is capable of cooling the crystal at an arbitrary cooling rate. As the cooling device of this nature, it suffices to use a device which can cool a given crystal by blowing a cooling gas or adopt a method for disposing at a fixed position on the surface of the molten silicon a water-cooling ring adapted to encircle the crystal in growth. In this case, by using the cooling method mentioned above and adjusting the speed of pulling the crystal in growth, it is made possible to confine the cooling rate within the range mentioned above.

Thus, in the CZ method or the magnetic field-applied CZ method, the silicon single crystal bar doped with nitrogen in a required concentration, made to contain oxygen in a required concentration, and grown at a required cooling rate can be obtained. This silicon single crystal bar is then sliced with such a cutting device as the inner peripheral blade slicer or the wire saw and subjected to the steps of chamfering, lapping, etching, and grinding to manufacture a silicon single crystal wafer. Naturally, these steps are enumerated here for the exclusive purpose of illustration. Various other steps such as washing are also conceivable. The sequence of these steps may be altered or part of the steps may be omitted properly to suit the purpose of use of the finished product.

The silicon single crystal wafer which is obtained as described above permits manufacture of a silicon semiconductor substrate which satisfies the relation, $0.2 \geq V/S/R$, providing V denotes the volume of void type defects (i.e. "empty hole" type defects"), S the surface area thereof, and R the radius of spherical defects presumed to have the same volume as the void type defects having the volume of V. Subsequently by subjecting the silicon semiconductor substrate to a gettering heat treatment and/or a heat treatment required for the production of a device, it is made possible to decrease the void type defects in the surface layer with excellent operational efficiency to such an extent as to preclude occurrence of defects in the produced device.

This invention defines the volume of the void type defects. The volume, V, and the surface area, S, were the numerical values obtained in the relevant experiment by tilting a sample of TEM and three-dimensionally measuring the void type defects in shape. The radius, R, was found by calculating the relational expression, $V=4\Pi R^3/3$, wherein V denotes the volume found by the visual observation of TEM.

The silicon semiconductor substrate contemplated by this invention has the nitrogen concentration thereof fall in the range of $1 \times 10^{14}$ atoms/cm$^3$~$1 \times 10^{16}$ atoms/cm$^3$ as determined by the analysis of nitrogen in accordance with the method of secondary ion mass analysis (SIMS). Then, the void type defects in the silicon single crystal, as specifically described herein below, have the shape thereof changed from an octahedron to a plate and further from a plate and/or a plate-like shape of a large ratio of change of shape to an oxygen precipitate (wholly OSF region), depending on the concentration of nitrogen increased by addition and the cooling rate used while the silicon single crystal being pulled passes through a temperature region of 1100° C. In this region, since the void type defects of a shape other than the octahedron have a large surface area as compared with the conventional octahedral void type defects, the heat treatment performed subsequently tends to promote diffusion of voids which are point defects and give rise to a surface defect-free layer. As regards the range for the ratio of volume/surface area of the void type defects of the shape of a plate and further the shape of a plate and/or a bar which have a larger surface area than the octahedral void type defects, it suffices to control the void type defects of such a shape as satisfies the relational expression, $0.2 \geq V/S/R$, by the state thereof prior to the heat treatment. When this relational expression is satisfied, the subsequent heat treatment will facilitate the extinction of the void type defects. Then, the amount of added nitrogen necessary for satisfying this condition is required to satisfy at least the condition of this invention, i.e. the range of $1 \times 10^{14}$ atoms/cm$^3$~$1 \times 10^{16}$ atoms/cm$^3$.

The silicon semiconductor substrate whose void type defects have been rendered more extinctive by the heat treatment is preferred to have an oxygen concentration of not more than $9.5 \times 10^{17}$ atoms/cm$^3$ and a nitrogen concentration in the range of $5 \times 10^{14}$~$1 \times 10^{16}$ atoms/cm$^3$ when the cooling rate is not less than 5° C./min before it is heat-treated in a non-oxidising atmosphere such as, for example, an atmosphere of one member or a mixture of two or more members selected from among such gases as hydrogen, nitrogen, argon, and helium. When the cooling rate is not less than 1° C./min and less than 5° C./min, the oxygen concentration is preferred to be not more than $8.5 \times 10^{17}$ atoms/cm$^3$ and a nitrogen concentration to be in the range of $1 \times 10^{13}$~$1 \times 10^{16}$ atoms/cm$^3$. Then, when the void type defects in the silicon semiconductor substrate whose nitrogen concentration has been controlled as described above have been made to assume spherical volumes, the radius R of such spherical volumes is preferred to satisfy the condition, $R \leq 30$ nm, when the cooling rate is not less than 5° C./min and the condition, $R \leq 75$ nm, when the cooling rate is not less than 1° C./min and less than 5° C.

Here, the case of using a cooling rate of not less than 1° C./min and less than 5° C./min and the case of using a cooling rate of not less than 5° C./min are discriminated because the nitrogen concentration that induces a change in form of the void type defects from an octahedron through a shape of plate and a shape of bar varies across a cooling rate of about 5° C./min as the boundary and the former cooling rate tends to increase the surface area to a greater extent than the latter cooling rate for a fixed amount of added nitrogen and to bring a greater effect in attaining extinction of the void type defects by the subsequent heat treatment even when such void type defects have larger dimensions. The radius R which this invention contemplates in presuming the void type defects to possess spherical volumes, therefore, is allowed to have a larger numerical value in the former case of using a slower cooling rate.

The reason for discriminating the ranges of oxygen concentration by the magnitude of cooling rate is that the ease with which the inner walls of the void type defects grow a silicon oxide film increases in accordance as the cooling rate is decreased and, for the sake of the extinction of the void type defects, the inner wall oxide film must be wholly diffused till extinction as the first step. When the cooling rate is slow, therefore, it becomes necessary to decrease the inner wall oxide film in thickness. To be specific, the oxygen concentration in the silicon semiconductor substrate prior to the heat treatment which is performed for the sake of the extinction of the void type defects must be controlled to a lower level than when the cooling rate is fast. Actually, the oxygen concentration of the silicon semiconductor substrate prior to the heat treatment is preferred to be limited within the range contemplated by this invention as will be specifically described herein below.

Of the silicon semiconductor substrate derived from the silicon single crystal grown by the CZ method or the magnetic field-applied CZ method using a cooling rate exceeding 1° C./min, preferably falling in the range of 1~15° C./min, the silicon semiconductor substrate that satisfies the relation, $0.2 \geq V/S/R$, before undergoing the heat treatment contemplated by this invention is heat-treated in the non-oxidising atmosphere mentioned above at a temperature exceeding 1150° C., preferably falling in the range of 1150~1250° C., for a duration exceeding one hour, preferably falling in the range of 2~4 hours when the maximum final temperature is 1150° C. or in the range of 1~2 hours when the maximum final temperature is in the range of 1200~1250° C. to produce a silicon semiconductor substrate which possesses a defect-free layer containing no void type defect in the surface layer and excelling in yield of device.

For the purpose of satisfying the condition, $0.2 \geq V/S/R$, for the shape allowing easy extinction of the void type defects thereby obtaining a silicon semiconductor substrate which has attained extinction of the void type defects in the surface layer of the silicon semiconductor substrate as aimed at by this invention, the silicon semiconductor substrate prior to the heat treatment is only required to contain nitrogen in a concentration in the range of $1 \times 10^{14} \sim 1 \times 10^{14}$ atoms/cm$^3$. For the purpose of enabling the silicon semiconductor substrate to incorporate therein nitrogen in the concentration mentioned above, it suffices to employ the CZ method or the magnetic field-applied CZ method in pulling molten silicon on the condition that the molten silicon contains nitrogen at a concentration in the range of $2 \times 10^{17} \sim 1.5 \times 10^{19}$ atoms/cm$^3$ during the course of a pulling operation. The cooling rate used while the silicon single crystal being pulled passes through a temperature zone of 1100° C. is only required to exceed 1° C./min. More preferably by defining the nitrogen concentration and the cooling rate respectively, the extinction of the void type defects from the surface of the silicon substrate subsequent to the heat treatment which is aimed at the extinction of the void type defects can be secured to a deeper region. When the cooling rate is not less than 1° C./min and less than 5° C./min, the nitrogen concentration in the silicon semiconductor substrate is preferred to be in the range of $1 \times 10^{15} \sim 1 \times 10^{16}$ atoms/cm$^3$ and that in the molten silicon in the process of being pulled is preferred to be in the range of $1 \times 10^{18} \times 1.5 \times 10^{19}$ atoms/cm$^3$ for the sake of the incorporation of nitrogen at the concentration mentioned above. When the cooling rate is not less than 5° C./min, the nitrogen concentration in the silicon semiconductor substrate is preferred to be in the range of $5 \times 10^{14} \sim 1 \times 10^{16}$ atoms/cm$^3$ and that in the molten silicon in the process of being pulled is preferred to be in the range of $2 \times 10^{17} \sim 1 \times 10^{19}$ atoms/cm$^3$ for the sake of the incorporation of nitrogen at the concentration mentioned above. When the silicon semiconductor substrate derived from the silicon single crystal grown under the conditions mentioned above is heat-treated in the non-oxidising atmosphere mentioned above at a temperature exceeding 1150° C., preferably falling in the range of 1150~1250° C. for a period exceeding one hour, preferably falling in the range of 2~4 hours when the maximum final temperature is 1150° C. or in the range of 1~2 hours when the maximum final temperature is in the range of 1200~1250° C., it produces a semiconductor substrate containing no void type defect in the surface layer and excelling in device yield.

The inner wall oxide film of the void type defects needs control as described above. When the cooling rate during the course of a pulling operation is not less than 1° C./min and less than 5° C./min, the oxygen concentration prior to the heat treatment is preferred to be not more than $8.5 \times 10^{17}$ atoms/cm$^3$. When the cooling rate is not less than 5° C./min, the oxygen concentration prior to the heat treatment is preferred to be not more than $9.5 \times 10^{17}$ atoms/cm$^3$.

According to this invention, when the silicon semiconductor substrate having the R satisfy the formula $R \leq 30$ nm is heat-treated in the non-oxidising atmosphere mentioned above at a temperature exceeding 1200° C., preferably falling in the range of 1200~1250° C. to produce a silicon semiconductor substrate having an oxygen concentration of not more than $6 \times 10^{16}$ atoms/cm$^3$ at a depth of 1 μm from the surface at the centre of the semiconductor substrate and a locally concentrated part originating in a nitrogen segregation exhibiting a concentration of not less than twice as high as the average signal strength at the centre of the silicon substrate depth in the determination of nitrogen concentration by the method of secondary ion mass analysis (SIMS), the produced silicon semiconductor substrate possesses a surface defect-free layer of a depth of not less than 5 μm at least and less than 12 μm from the surface, enjoys a satisfactory device yield such that the oxygen precipitate density is not less than $1 \times 10^9$ pieces/cm$^3$ at the centre of depth in the central part of the silicon substrate, and excels in the gettering property.

Further, according to this invention, when the silicon semiconductor substrate having the R satisfy the formula $R \leq 75$ nm is heat-treated in the non-oxidising atmosphere mentioned above at a temperature exceeding 1200° C., preferably falling in the range of 1200~1250° C. to produce a silicon semiconductor substrate having an oxygen concentration of not more than $5 \times 10^{16}$ atoms/cm$^3$ at a depth of 1 μm from the surface at the centre of the semiconductor substrate and a locally concentrated part originating in a nitrogen segregation exhibiting a concentration of not less than twice as high as the average signal strength at the centre of the silicon substrate depth in the determination of nitrogen concentration by the method of secondary ion mass analysis (SIMS), the produced silicon semiconductor substrate possesses a surface defect-free layer of a depth of not less than 5 μm at least and less than 12 μm from the surface, enjoys a satisfactory device yield such that the oxygen precipitate density is not less than $5 \times 10^8$ pieces/cm$^3$ at the centre of depth in the central part of the silicon substrate, and excels in the gettering property.

DETAILED DESCRIPTION OF THE PREFERRED EMBODIMENTS

Now, this invention will be described more specifically below with reference to working examples and controls adduced for illustration. It should be noted that this invention is not limited to the examples.

By the CZ method, a raw material polycrystalline silicon was placed in a quartz crucible of 18 inches in the production of a wafer 6 inches in diameter, 22 inches in the production of a wafer 8 inches in diameter, and 24 inches in the production of a wafer 12 inches in diameter and a P type silicon single crystal bar measuring 6 inches, 8 inches, or 12 inches respectively in diameter and having an orientation of <100> and a specific resistance in the range of 8.5~11.5 Ωcm was prepared under varied conditions of nitrogen concentration, oxygen concentration, average pulling speed SL (mm/min), and cooling rate.

The control of the amount of nitrogen used for doping was effected by causing the raw material to incorporate in advance therein a silicon wafer possessing a prescribed amount of silicon nitride film. The control of the oxygen concentration was effected by adjusting the rotation of the crucible during the course of the pulling operation. The control of the cooling rate was effected by varying the speed of pulling the single crystal bar thereby varying the speed of growth of the crystal. The produced silicon single crystal bar was tested for varying properties. The results were as shown in Table 1. In the first column, (e) means that the ingot type is used for an example, (c) means that it is used for a comparative example.

TABLE 1

| Ingot | Nitrogen concentration in melt (atoms/cm$^3$) | Cooling rate (° C./min) | Oxygen concentration (atoms/cm$^3$) | Average SL (mm/min) | Wafer diameter (inches) |
| --- | --- | --- | --- | --- | --- |
| A (e) | $5 \times 10^{17}$ | 11 | $8.5\sim9.5 \times 10^{17}$ | 2.2 | 6 |
| B (e) | $3 \times 10^{17}$ | 5.5 | $8.5\sim9.5 \times 10^{17}$ | 1.5 | 6 |
| C (e) | $5 \times 10^{17}$ | 7 | $8.0\sim9.0 \times 10^{17}$ | 1.8 | 6 |
| D (c) | 0 | 11 | $8.5\sim9.5 \times 10^{17}$ | 2.2 | 6 |
| E (c) | 0 | 7 | $8.5\sim9.5 \times 10^{17}$ | 1.8 | 6 |
| F (c) | $1 \times 10^{17}$ | 11 | $8.5\sim9.5 \times 10^{17}$ | 2.2 | 6 |
| G (c) | $1 \times 10^{17}$ | 5.5 | $8.5\sim9.5 \times 10^{17}$ | 1.5 | 6 |
| H (e) | $1 \times 10^{18}$ | 4.5 | $7.5\sim8.5 \times 10^{17}$ | 1.4 | 8 |
| I (e) | $1 \times 10^{18}$ | 2.5 | $7.0\sim8.0 \times 10^{17}$ | 1.1 | 8 |
| J (e) | $1 \times 10^{18}$ | 2 | $7.0\sim8.0 \times 10^{17}$ | 0.8 | 8 |
| K (c) | 0 | 4.5 | $8.5\sim9.5 \times 10^{17}$ | 1.4 | 8 |
| L (c) | 0 | 2.5 | $8.5\sim9.5 \times 10^{17}$ | 1.1 | 8 |
| M (c) | 0 | 2 | $8.5\sim9.5 \times 10^{17}$ | 0.8 | 8 |
| N (c) | $2 \times 10^{17}$ | 2.5 | $7.0\sim8.0 \times 10^{17}$ | 1.1 | 8 |
| O (e) | $1 \times 10^{18}$ | 2.2 | $7.0\sim8.0 \times 10^{17}$ | 0.8 | 12 |
| P (c) | 0 | 2.2 | $8.5\sim9.5 \times 10^{17}$ | 0.8 | 12 |
| Q (e, c) | $5 \times 10^{17}$ | 1.5 | $8.0\sim9.0 \times 10^{17}$ | 0.8 | 6 |
| R (e, c) | $1 \times 10^{16}$ | 1.5 | $8.0\sim9.0 \times 10^{17}$ | 0.8 | 6 |

From the single crystal bar obtained as described above, wafers were sliced by the use of a wire saw. The wafers were subjected to the steps of lapping, etching, and mirror grinding under nearly identical conditions other than the amount of nitrogen used for doping, the oxygen concentration, and the cooling rate to manufacture varying sets each of a plurality of mirror face wafers of silicon single crystal.

The silicon single crystal wafers thus obtained were subjected to a heat treatment which was aimed at effecting extinction of void type defects and performing a gettering treatment. The heat treatment in this case was carried out by heating a given silicon single crystal wafer in an atmosphere composed of 20 vol % of nitrogen and 80 vol % of argon at a temperature increasing rate of 8° C./min in a temperature zone of 800~1000° C., at a temperature increasing rate of 4° C./min in a temperature zone of 1000~1100° C., at a temperature increasing rate of 1° C./min in a temperature zone of 1100~1150° C., and at a temperature increasing rate of 1° C./min in a temperature zone of 1150~1200° C., retaining the heated wafer for 4 hours or 8 hours when the maximum final temperature was 1150° C. and for 30 minutes to two hours when the temperature was 1200° C., and then cooling the wafer at a temperature decreasing rate of 1° C./min in a temperature zone of 1200~1150° C., at a temperature decreasing rate of 1° C./min in a temperature zone of 1150~1100° C., and at a temperature decreasing rate of 4° C./min in a temperature zone of 1100~800° C. The non-oxidising atmosphere used for the heat treatment retained its behaviour intact even when the ratio of argon and hydrogen in vol % varied. In an extreme case, the argon concentration could be 100 vol %.

Then, the silicon single crystal wafers were tested for depth of a defect-free layer. For this evaluation of the depth of a defect-free layer, the wafers had their surfaces reground to prepare wafers having varying amounts removed from the surface by the grinding. Then, the wafers were washed in a SC-1 liquid mixture (having aqua ammonia (NH$_4$OH), an aqueous hydrogen peroxide solution (H$_2$O$_2$), and extrapure water mixed at a ratio of 1:1:20) at a temperature of about 80° C. for one hour to visualise minute COP particles. The wafer surfaces were examined with a particle testing device made by KLA/Tencor Corp. and sold under the product code of SPI to take count of crystal originated particles (COP) existing on the wafer surfaces and measuring not less than 0.10 μm in diameter. Then, the COP volume density was determined by performing the washing of a given sample with the SC-1 liquid mixture up to ten repetitions, finding the increase in the number of COP's from the number prior to the washing to the number after the 10 rounds of washing, and dividing this increase by the volume removed by the etching with the SC-1 liquid mixture. The removal of the wall of the wafer was performed till varying depths of 1, 3, 5, 7, 10, and 12 μm.

The tables contain the results of investigations on the locally concentrated part originating in a nitrogen segregation exhibiting a concentration of not less than twice as high as the average signal strength at the centre of the silicon substrate depth in the determination of nitrogen concentration by the method of secondary ion mass analysis (SIMS).

As respects the depth of a defect-free layer, wafers having various amounts thereof removed by grinding from the surface were rated for the quality of oxide film manifested in resisting pressure. The quality of oxide film in gate oxide integrity (GOI) was evaluated in terms of the high C mode yield of time zero dielectric breakdown (TZDB). To be more specific, phosphorus-doped polysilicon electrodes (having an oxide film thickness of 25 nm and an electrode area of 20 mm$^2$) were prepared and tested with a reference current of 100 mA/cm$^2$ for dielectric breakdown electric field. The electrodes showing values exceeding 11 MV/cm were rated as conforming samples. All the electrodes within a wafer surface were subjected to the test to determine the efficiency percentage.

EXAMPLE 1

Wafer Having a Diameter of 6 Inches

The data of such examples as satisfying the relational expression, $0.2 \geq V/S/R$, of the shape of void type defects are shown in Table 2.

TABLE 2

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | High C mode yield of TZDB at a depth of 5 μm (%) |
|---|---|---|---|---|---|---|---|---|---|---|
| D | 0 | 9.4 | 11 | 2.51 | 224800 | 19500 | 36.4 | 0.32 | 1150 × 4 | 0 |
| E | 0 | 9.3 | 7 | 3.16 | 327000 | 38000 | 41.2 | 0.21 | 1150 × 4 | 0 |
| F | 1.8 | 8.8 | 11 | 2.51 | 185600 | 20200 | 35.4 | 0.26 | 1150 × 4 | 61 |
| G | 8 | 9.1 | 1.5 | 6.3 | 397800 | 79300 | 45.6 | 0.11 | 1150 × 4 | 97 |
| H | 11 | 9.2 | 1.5 | 10 | 154700 | 51600 | 33.3 | 0.09 | 1150 × 4 | 99 |

While the samples of the ingots (the row of IC in the table, wherein IC denotes the ingot type specified in Table 1) D and E showed no discernible sign of a locally concentrated part of nitrogen, the other samples incorporating nitrogen showed a discernible sign of such locally concentrated part.

Though the wafers worked from a single crystal ingot of type Q (see Table 1) had slightly larger volumes of void type defects (hereinafter referred to as "voids"), they were confirmed to have higher ratios of high C mode yield by TZDB evaluation at a depth of 5 μm (the ratios of cells showing dielectric breakdown electric fields exceeding 11 MV/cm to all the cells in the wafer under application of 100 mA) because of higher ratios of change in shape of voids (V/S/R). This fact may justify an inference that the ease with which the heat treatment performed subsequently to the fabrication of wafer effects the extinction of void type defects is exalted by controlling the change in shape of voids within the range of the ratio of change in shape of voids defined according to the invention.

EXAMPLE 2

Wafer Having a Diameter of 6 Inches

Working examples of silicon semiconductor substrates using wafers not undergoing a heat treatment defined for the invention and satisfying the conditions of the invention are shown in Table 3 below.

falling within the respective ranges contemplated by this invention, they satisfied the relational expression, $0.2 \geq V/S/R$, indicating the change in shape of voids and, at the same time, attained the depth of a defect-free layer allowing the presence of void type defects (indicated as COP DZ in the table) to greater regions than those attainable heretofore. Incidentally, the COP DZ layers showed no discernible sign of oxygen precipitate defects.

The definition of the COP DZ is that the COP volume density obtained after the repeated washing with the SC-1 liquid mixture be not more than $2 \times 10^5$ pieces/$cm^3$ and the region satisfying the lower limit of 11 MV/cm under application of 100 mA/$cm^2$ in the evaluation of TZDB be not less than 90%.

Comparative Example 1

Wafer Having a Diameter of 6 Inches

Silicon semiconductor substrates obtained by using silicon semiconductor substrates not satisfying the invention and still awaiting heat treatment and heat-treating them under the conditions satisfying the invention were examined to confirm the COP DZ. The results are shown in Table 4.

TABLE 3

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ (μm) | Locally concentrated part of nitrogen |
|---|---|---|---|---|---|---|---|---|---|---|---|
| A | 8.1 | 9.0 | 11 | 1.26 | 29400 | 11500 | 18.6 | 0.14 | 1150 × 4 | 7 | observed |
| A | 12 | 8.6 | 11 | 1.79 | 7630 | 3400 | 11.9 | 0.18 | 1150 × 4 | 7 | observed |
| B | 6.3 | 9.1 | 5.5 | 1.58 | 80750 | 19750 | 26 | 0.16 | 1150 × 4 | 5 | observed |
| B | 3.2 | 9.1 | 5.5 | 1.99 | 35200 | 10960 | 19 | 0.16 | 1150 × 4 | 5 | observed |
| C | 6.8 | 8.8 | 7 | 1.26 | 68000 | 17950 | 25.2 | 0.15 | 1150 × 4 | 6 | observed |
| C | 12 | 8.1 | 7 | 0.79 | 12200 | 6590 | 14.3 | 0.13 | 1150 × 4 | 6 | observed |

Since the working examples possessed such nitrogen concentrations, oxygen concentrations, and cooling rate as

TABLE 4

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ (μm) | Locally concentrated part of nitrogen |
|---|---|---|---|---|---|---|---|---|---|---|---|
| D | 0 | 9.4 | 11 | 2.51 | 224800 | 19500 | 36.4 | 0.32 | 1150 × 4 | 3 | None |
| E | 0 | 9.3 | 7 | 3.16 | 327000 | 38050 | 41.2 | 0.21 | 1150 × 4 | 2 | None |

TABLE 4-continued

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ (μm) | Locally concentrated part of nitrogen |
|---|---|---|---|---|---|---|---|---|---|---|---|
| F | 1.1 | 8.9 | 11 | 1.26 | 103900 | 13700 | 29.2 | 0.26 | 1150 × 4 | 3 | observed |
| F | 1.8 | 8.6 | 11 | 2.51 | 144000 | 11980 | 32.4 | 0.23 | 1150 × 4 | 3 | observed |

The samples of this comparative example were confirmed to have heretofore usual small COP DZ depths as compared with the samples of Example 2 described above because their nitrogen concentrations did not satisfy the invention.

EXAMPLE 3

Wafer Having a Diameter of 8 Inches

Examples of silicon semiconductor substrates using wafers awaiting the heat treatment of the invention and satisfying the conditions of the invention are indicated as ingots (row of IG) H and I in the following Table 5 and examples of silicon semiconductor substrates satisfying the invention are indicated as ingots O.

nitrogen concentration to be in the range between $5 \times 10^{14}$ atoms/$cm^3$ and $1 \times 10^{16}$ atoms/$cm^3$, whereas the ingot O did not satisfy this range but satisfied only the relational expression $0.2 \geq V/S/R$. This fact justifies an inference that the depth of COP DZ was small when the duration of the heat treatment was insufficient.

Comparative Example 2

Wafers Having Diameters of 8 and 12 Inches

The data of this comparative example not satisfying the ranges defined by this invention are shown in the following

TABLE 5

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ (μm) | Locally concentrated part of nitrogen |
|---|---|---|---|---|---|---|---|---|---|---|---|
| H | 10.2 | 8.5 | 4.5 | 3.16 | 63000 | 13750 | 23.9 | 0.19 | 1150 × 4 | 4 | observed |
| H | 18 | 7.3 | 4.5 | 1.26 | 7070 | 3960 | 11.9 | 0.15 | 1150 × 4 | 5 | observed |
| I | 16 | 7.4 | 2.5 | 6.31 | 26900 | 13150 | 18.6 | 0.11 | 1150 × 4 | 5 | observed |
| O | 1.1 | 7.8 | 2.2 | 12.6 | 194900 | 41800 | 34.7 | 0.13 | 1150 × 8 | 4 | observed |
| O | 1.2 | 7.7 | 2.2 | 10 | 717000 | 171400 | 53.3 | 0.08 | 1150 × 8 | 4 | observed |

Since the samples of this example possessed such nitrogen concentrations, oxygen concentrations, and cooling rate as falling within the respective ranges contemplated by this invention prior to undergoing the heat treatment defined by this invention, they satisfied the relational expression, $0.2 \geq V/S/R$, indicating the change in shape of voids according to the invention and, at the same time, attained the depth of a defect-free layer allowing the presence of void type defects (indicated as COP DZ in the table) to greater regions than those attainable heretofore as shown in the data of Table 5 mentioned above. Incidentally the COP DZ layers of the samples showed no discernible sign of oxygen precipitate defects. The ingots H and I satisfied the condition for the Table 6. Since the samples of this control had nitrogen concentrations deviating from the range contemplated by this invention, they did not satisfy the relational expression, $0.2 \geq V/S/R$, indicating the change in form of voids. Since this comparative example fell in the scope of the prior art invention, the samples thereof had very small depths of COP DZ as compared with the samples of Example 3 described above.

TABLE 6

| IG | [N] ($10^{14}$ atoms/ $cm^3$) | [Oi] ($10^{17}$ atoms/ $cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ (μm) | Locally concentrated part of nitrogen |
|---|---|---|---|---|---|---|---|---|---|---|---|
| K | 0 | 9.3 | 4.5 | 7.94 | 1038700 | 63600 | 62.8 | 0.26 | 1150 × 8 | 2 | None |
| L | 0 | 8.8 | 2.5 | 12.6 | 2055300 | 108500 | 78.9 | 0.24 | 1150 × 8 | 1 | None |
| M | 0 | 9.4 | 2 | 19.9 | 3090000 | 141300 | 86.4 | 0.25 | 1150 × 8 | 1 | None |
| P | 0 | 9.2 | 2.2 | 15.9 | 2873000 | 125300 | 88.2 | 0.26 | 1150 × 8 | 1 | None |

Here, the ingot M measured 8 inches in diameter and showed a low cooling rate. The ingot P measured 12 inches in diameter did not allow easy extinction of voids even when it was heat-treated in the aforementioned non-oxidising atmosphere at 1150° C. for eight hours because it had large void volumes. The data suggest that the ease with which the extinction of voids was attained decreased in proportion as the increase of the void volumes and the extinction was in need of the effect of this invention.

Comparative Example 3

Wafer Having a Diameter of 8 Inches

The data of samples obtained by using silicon semiconductor substrates satisfying the relational expression, $0.2 \geq V/S/R$, and not satisfying the invention and still awaiting the heat treatment and subjecting them to a heat treatment of the invention are shown in Table 7.

TABLE 7

| IG | [N] ($10^{14}$ atoms/$cm^3$) | [Oi] ($10^{17}$ atoms/$cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ ($\mu$m) | Locally concentrated part of nitrogen |
|---|---|---|---|---|---|---|---|---|---|---|---|
| N | 4 | 7.8 | 2.5 | 10 | 619000 | 78400 | 52.7 | 0.15 | 1150 × 8 | 3 | observed |
| N | 9 | 7.2 | 2.5 | 7.94 | 135800 | 34300 | 30.8 | 0.13 | 1150 × 8 | 4 | observed |
| J | 3 | 7.8 | 2 | 12.6 | 412000 | 90500 | 44.4 | 0.1 | 1150 × 8 | 4 | observed |

Under the conditions mentioned above, the voids underwent changes of form within the range defined by the relational expression, $0.2 \geq V/S/R$, and nevertheless allowed no easy extinction of voids by the heat treatment because of excessively large void volumes. These results imply that more preferably the nitrogen concentrations ought to be controlled within the range between $5 \times 10^{14}$ atoms/$cm^3$ and $1 \times 10^{16}$ atoms/$cm^3$ as demonstrated in Example 3. The regions of COP DZ, however, were expanded to greater depths than when the change in form of voids did not satisfy the relational expression, $0.2 \geq V/S/R$, as demonstrated in Comparative Example 2 described above (wafers resulting from heat-treating materials incorporating no nitrogen).

It is clear from the examples and comparative examples described above that for the purpose of producing a silicon semiconductor substrate possessing a COP DZ in a greater depth, it is preferable to satisfy this invention, use a wafer having nitrogen concentration, oxygen concentration, and cooling rate within the ranges of the invention and still awaiting the heat treatment, and subjecting this wafer to the heat treatment under the conditions of the invention.

EXAMPLE 5

Wafers Measuring 6, 8, and 12 Inches in Diameter and Using a Maximum Final Temperature of 1200° C.

This example was meant as a contrast to the invention and was aimed at providing silicon semiconductor substrates materialising COP DZ of very large depths approximating closely to about 10 $\mu$m. Further, samples aimed at realising the COP DZ in depths equalling those recited in the invention and, at the same time, realising the reduction of the duration required for production are shown in Table 8.

TABLE 8

| IG | [N] ($10^{14}$ atoms/$cm^3$) | [Oi] ($10^{17}$ atoms/$cm^3$) | Cooling Rate (° C./min) | OPP signal strength (V) | Void volume V ($nm^3$) | Surface area of void ($nm^2$) | Radius, R, of spherical voids (nm) | V/S/R | Annealing conditions (° C. × h) | COP DZ ($\mu$m) | Locally concentrated part of nitrogen |
|---|---|---|---|---|---|---|---|---|---|---|---|
| A | 8.1 | 9.0 | 11 | 1.26 | 29400 | 11500 | 18.6 | 0.14 | 1200 × 0.5 | 7 | observed |
| A | 12 | 8.6 | 11 | 0.79 | 7630 | 3400 | 11.9 | 0.18 | 1200 × 0.5 | 7 | observed |
| C | 6.8 | 8.8 | 7 | 1.26 | 68000 | 17950 | 25.2 | 0.15 | 1200 × 0.5 | 6 | observed |
| C | 12 | 8.1 | 7 | 0.79 | 12200 | 6590 | 14.3 | 0.13 | 1200 × 0.5 | 6 | observed |
| A | 8.1 | 9.0 | 11 | 1.26 | 29400 | 11500 | 18.6 | 0.14 | 1200 × 1 | 10 | observed |
| A | 12 | 8.6 | 11 | 0.79 | 7630 | 3400 | 11.9 | 0.18 | 1200 × 1 | 11 | observed |
| C | 6.8 | 8.8 | 7 | 1.26 | 68000 | 17950 | 25.2 | 0.15 | 1200 × 1 | 9 | observed |
| C | 12 | 8.1 | 7 | 0.79 | 12200 | 6590 | 14.3 | 0.13 | 1200 × 1 | 10 | observed |
| H | 10.2 | 8.5 | 4.5 | 3.16 | 63000 | 13750 | 23.9 | 0.19 | 1200 × 1 | 8 | observed |
| H | 18 | 7.3 | 4.5 | 1.26 | 7070 | 3960 | 11.9 | 0.15 | 1200 × 1 | 11 | observed |
| I | 16 | 7.4 | 2.5 | 6.31 | 26900 | 13150 | 18.6 | 0.11 | 1200 × 1 | 9 | observed |
| O | 1.1 | 7.8 | 2.2 | 12.6 | 194900 | 41800 | 34.7 | 0.13 | 1200 × 1 | 6 | observed |
| O | 1.2 | 7.7 | 2.2 | 10 | 717000 | 171400 | 53.3 | 0.08 | 1200 × 1 | 5 | observed |

The invention includes techniques for producing silicon semiconductor substrates having COP DZ of not less than 5 $\mu$m and less than 12 $\mu$m by using silicon semiconductor substrates of the invention and still awaiting the heat treatment and subjecting such substrates to the heat treatment of the invention.

With reference to Table 8, when the silicon semiconductor substrates, identified as ingots A and C, and still awaiting the heat treatment were heat-treated according to the invention, the depths of COP DZ were invariably not less than 5 $\mu$m and less than 12 $\mu$m. When these samples were tested for oxygen concentration at a depth of 1 $\mu$m from the surface in accordance with the method of secondary ion mass analysis (SIMS), the oxygen concentrations consequently found were not more than $6 \times 10^{16}$ atoms/$cm^3$. When they were tested for density of oxygen precipitates which are effective for impurity gettering by means of a BMD analyser, the found values of density were not more than $1\times10^9$ pieces/cm$^3$.

When the silicon semiconductor substrates, identified as ingots H, I, and O, which satisfied the invention and still awaiting the heat treatment were heat-treated according to the invention, the depths of COP DZ were invariably not less than 5 μm and less than 12 μm. When these samples were tested for oxygen concentration at a depth of 1 μm from the surface in accordance with the method of secondary ion mass analysis (SIMS), the oxygen concentrations consequently found were not more than $5\times10^{16}$ atoms/cm$^3$. When they were tested for density of oxygen precipitates which are effective for impurity gettering by means of a BMD analyser, the found values of density were not more than $1\times10^9$ pieces/cm$^3$.

The results of Table 8 were summarized so as to be easily compared with those of the samples of the invention. In short, the case of performing the heat treatment at a temperature of 1150° C. and the case of performing the heat treatment at a temperature of 1200° C. as in Examples 1 and 2 were compared in terms of the duration of heat treatment. The results are shown in Table 9 (indicated in the ratios based on 1150° C.×4 hours taken as 1). Incidentally, the duration of the heat treatment embraces the duration required in inserting a sample in an oven at 800° C. when the wafer measured 6 inches in diameter and at 700° C. when the wafer measured 8 inches or 12 inches and the duration required in increasing the temperature to 1150° C. and 1200° C. and increasing the temperature thence.

TABLE 9

| Diameter of wafer (inch) | Temperature during insertion (° C.) | Temperature and duration of heat treatment (° C. × h) | Ratio of duration of heat treatment | COP DZ (μm) |
| --- | --- | --- | --- | --- |
| 6 | 800 | 1150 × 4 | 1 | 6~7 |
| 6 | 800 | 1200 × 0.5 | 0.68 | 6~7 |
| 6 | 800 | 1200 × 1 | 0.88 | 9~11 |
| 8 | 700 | 1150 × 8 | 1.4 | 6 |
| 8 | 700 | 1200 × 1 | 1 | 8~11 |
| 12 | 700 | 1150 × 8 | 1.4 | 4 |
| 12 | 700 | 1200 × 1 | 1 | 5~6 |

As shown in Table 5, when wafers which had the surface areas of voids enlarged according to the invention, and the volumes of voids adjusted according to the invention, were and then heat-treated at a temperature of 1200° C. under the conditions defined by this invention, they produced silicon semiconductor substrates which possessed such quality and productivity that the COP DZ could be enlarged where the diameter of wafer was fixed and the duration of the annealing step was similarly fixed, and the duration of the heat treatment could be decreased when the COP DZ to be realised had a fixed quality.

They also could accomplish defect-free surface layers (COP DZ) having amply large depths even when the wafers had their diameters enlarged and the void volumes were enlarged.

Incidentally, the term "COP DZ" as used in this specification is defined as the presence of the freeness from the defects at the relevant depth which is announced when the COP volume density attained by the repeated washing is not more than $2\times10^5$ pieces/cm$^3$ and the ratio of acceptance of TZDB is not less than 90%. Naturally, this region shows no discernible sign of oxygen precipitates which are useful for the gettering of impurities.

Effect of the Invention

As described above, the silicon semiconductor substrate contemplated by this invention has only to control the amount of nitrogen to be added, the oxygen concentration, and the cooling rate of the silicon single crystal being pulled while this crystal during the ascent passes through a temperature zone of 1100° C. within specific ranges fit for easy extinction of void type defects by an annealing material to produce a silicon semiconductor showing a satisfactory device yield and enjoying high quality. Further, the reduction in the duration of production can be realised.

Accordingly, while a few embodiments of the present invention have been shown and described, it is to be understood that many changes and modifications may be made thereunto without departing from the spirit and scope of the invention as defined in the appended claims.

What is claimed is:

1. A silicon semiconductor substrate derived from a silicon single crystal grown by Czochralski method or magnetic field-applied Czochralski method, comprising satisfying a relation, $0.2 \geq V/S/R$, providing V denotes the volume of void type defects, S the surface area thereof, and R the radius of spherical defects presumed to have the same volume as the void type defects having the volume of V.

2. A silicon semiconductor substrate according to claim 1, which contains nitrogen at a concentration of not less than $1\times10^{14}$ atoms/cm$^3$ and not more than $1\times10^{16}$ atoms/cm$^3$.

3. A silicon semiconductor substrate according to claim 1, wherein the void type defects in the silicon semiconductor substrate having an oxygen concentration of not more than $9.5\times10^{17}$ atoms/cm$^3$ and a nitrogen concentration of not less than $5\times10^{14}$ atoms/cm$^3$ and not more than $1\times10^{16}$ atoms/cm$^3$, when presumed to have spherical volumes, have a radius R satisfying $R \geq 30$ nm.

4. A silicon semiconductor substrate according to claim 1, wherein the void type defects in the silicon semiconductor substrate having an oxygen concentration of not more than $8.5\times10^{17}$ atoms/cm$^3$ and a nitrogen concentration of not less than $5\times10^{14}$ atoms/cm$^3$ and not more than $1\times10^{16}$ atoms/cm$^3$, when presumed to have spherical volumes, have a radius R satisfying $R \geq 75$ nm.

5. A method for the production of a silicon semiconductor substrate, comprising the steps of providing a silicon semiconductor substrate set forth in claim 1 as derived from a silicon single crystal grown by the Czochralski method or the magnetic field-applied Czochralski method using a cooling rate of not less than 1° C./min while the silicon single crystal being pulled passes through a temperature zone of 1100° C.; and heat-treating the silicon semiconductor substrate in a non-oxidizing atmosphere at a temperature of not less than 1150° C. for not less than one hour.

6. A method for the production of a silicon semiconductor substrate, comprising the steps of providing a silicon semiconductor substrate set forth in claim 2 as derived from a silicon single crystal grown by the Czochralski method or the magnetic field-applied Czochralski method using molten silicon containing nitrogen at a concentration of not less than $1\times10^{17}$ atoms/cm$^3$ and not more than $1.5\times10^{19}$ atoms/cm$^3$ and using a cooling rate of not less than 1° C./min while the silicon single crystal being pulled passes through a temperature zone of 1100° C.; and and heat-treating the silicon semiconductor substrate in a non-oxidizing atmosphere at a temperature of not less than 1150° C. for not less than one hour.

7. A method for the production of a silicon semiconductor substrate, comprising the steps of providing a silicon semiconductor substrate set forth in claim 3 as derived from a silicon single crystal grown by the Czochralski method or the magnetic field-applied Czochralski method using molten silicon containing nitrogen at a concentration of not less than $5 \times 10^{17}$ atoms/cm$^3$ and not more than $1.5 \times 10^{19}$ atoms/cm$^3$ and using a cooling rate of not less than 5° C./min while the silicon single crystal being pulled passes through a temperature zone of 1100° C.; and and heat-treating the silicon semiconductor substrate in a non-oxidizing atmosphere at a temperature of not less than 1150° C. for not less than one hour.

8. A method for the production of a silicon semiconductor substrate, comprising the steps of providing a silicon semiconductor substrate set forth in claim 4 as derived from a silicon single crystal grown by the Czochralski method or the magnetic field-applied Czochralski method using molten silicon containing nitrogen at a concentration of not less than $1 \times 10^{18}$ atoms/cm$^3$ and not more than $1.5 \times 10^{19}$ atoms/cm$^3$ and using a cooling rate of not less than 1° C./min and less than 5° C./min while the silicon single crystal being pulled passes through a temperature zone of 1100° C.; and heat-treating the silicon semiconductor substrate in a non-oxidizing atmosphere at a temperature of not less than 1150° C. for not less than one hour.

9. A method for the production of a silicon semiconductor substrate, comprising the steps of heat-treating a silicon, semiconductor substrate set forth in claim 3 in a non-oxidizing atmosphere at a temperature of not less than 1200° C. thereby causing the semiconductor substrate to acquire an oxygen concentration of not more than $6 \times 10^{16}$ atoms/cm$^3$ at a depth of 1 μm from the surface at the center thereof, a locally concentrated part originating in a nitrogen segregation exhibiting a concentration of not less than twice as high as the average signal strength at the center of the silicon substrate depth in the determination of nitrogen concentration by the method of secondary ion mass analysis (SIMS), a surface defect-free layer of a depth of not less than 5 μm and less than 12 μm from the surface, and an oxygen precipitate density of not less than $1 \times 10^9$ pieces/cm$^3$ at the center of depth of the central part of the silicon substrate.

10. A method for the production of a silicon semiconductor substrate, comprising the steps of heat-treating a silicon semiconductor substrate set forth in claim 4 in a non-oxidising atmosphere at a temperature of not less than 1200° C. thereby causing the semiconductor substrate to acquire an oxygen concentration of not more than $5 \times 10^{16}$ atoms/cm$^3$ at a depth of 1 μm from the surface at the center thereof, a locally concentrated part originating in a nitrogen segregation exhibiting a concentration of not less than twice as high as the average signal strength at the center of the silicon substrate depth in the determination of nitrogen concentration by the method of secondary ion mass analysis (SIMS), a surface defect-free layer of a depth of not less than 5 μm and less than 12 μm from the surface, and an oxygen precipitate density of not less than $5 \times 10^8$ pieces/cm$^3$ at the center of depth of the central part of the silicon substrate.

* * * * *